(12) United States Patent
Kim

(10) Patent No.: US 10,340,255 B2
(45) Date of Patent: *Jul. 2, 2019

(54) SEMICONDUCTOR APPARATUS AND SEMICONDUCTOR SYSTEM INCLUDING THE SAME

(71) Applicant: SK hynix Inc., Icheon-si, Gyeonggi-do (KR)

(72) Inventor: Kwan Dong Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/036,413

(22) Filed: Jul. 16, 2018

(65) Prior Publication Data
US 2018/0323176 A1    Nov. 8, 2018

Related U.S. Application Data

(63) Continuation-in-part of application No. 15/483,444, filed on Apr. 10, 2017, now Pat. No. 10,050,017.

(30) Foreign Application Priority Data

Sep. 5, 2016    (KR) .......................... 10-2016-0113798

(51) Int. Cl.
*H01L 23/48*    (2006.01)
*H01L 23/52*    (2006.01)
*H01L 29/40*    (2006.01)
*H01L 25/065*    (2006.01)
*H01L 23/00*    (2006.01)
*H01L 27/11*    (2006.01)
*H01L 27/112*    (2006.01)
*H01L 27/108*    (2006.01)
*H01L 23/522*    (2006.01)

(52) U.S. Cl.
CPC ........ *H01L 25/0657* (2013.01); *H01L 23/522* (2013.01); *H01L 24/09* (2013.01); *H01L 24/17* (2013.01); *H01L 27/10897* (2013.01); *H01L 27/1116* (2013.01); *H01L 27/11286* (2013.01); *H01L 24/06* (2013.01); *H01L 24/48* (2013.01); *H01L 24/49* (2013.01); *H01L 2224/16146* (2013.01); *H01L 2224/16235* (2013.01); *H01L 2224/48145* (2013.01); *H01L 2224/48227* (2013.01)

(58) Field of Classification Search
CPC . H01L 2225/06541; H01L 2224/48227; H01L 2225/06548; H01L 24/06; H01L 2224/32145; H01L 2224/48145
USPC ................................. 257/784, 786, 686, 777
See application file for complete search history.

(56) References Cited

U.S. PATENT DOCUMENTS

| | | | |
|---|---|---|---|
| 5,120,421 A * | 6/1992 | Glass | ..................... G01N 27/27 204/400 |
| 8,417,870 B2 | 4/2013 | Lee et al. | |
| 8,756,364 B1 | 6/2014 | Bhakta et al. | |
| 10,050,017 B2 * | 8/2018 | Kim | ................... H01L 25/0657 |

(Continued)

*Primary Examiner* — S. V. Clark
(74) *Attorney, Agent, or Firm* — William Park & Associates Ltd.

(57) ABSTRACT

A semiconductor apparatus may include a package substrate, and a plurality of semiconductor chips. Wherein the package substrate and the semiconductor chips may be configured based on a load value of the semiconductor apparatus.

18 Claims, 11 Drawing Sheets

(56) References Cited

U.S. PATENT DOCUMENTS

| | | | |
|---|---|---|---|
| 2009/0027366 A1* | 1/2009 | Kim | G09G 3/3685 345/204 |
| 2010/0244175 A1* | 9/2010 | Park | H01L 27/14636 257/459 |
| 2013/0020647 A1* | 1/2013 | Hwang | H01L 27/11565 257/365 |
| 2014/0118055 A1* | 5/2014 | Seok | H01L 24/06 327/432 |
| 2016/0204111 A1* | 7/2016 | Park | H01L 23/3171 257/324 |

* cited by examiner

SEMICONDUCTOR APPARATUS AND SEMICONDUCTOR SYSTEM INCLUDING THE SAME

CROSS-REFERENCES TO RELATED APPLICATION

This application is a continuation-in-part of application Ser. No. 15/483,444, filed on Apr. 10, 2017, and claims priority of Korean Patent Application No. 10-2016-0113798 filed on Sep. 5, 2016, which is incorporated herein by reference in its entirety.

BACKGROUND

1. Technical Field

Various embodiments may generally relate to a semiconductor technology, and, more particularly, to a semiconductor apparatus and a system including the same.

2. Related Art

As the capacities and the degrees of integration of semiconductor apparatuses are increased, various types of stack semiconductor apparatuses are being developed. In a stack semiconductor apparatus, a plurality of chips may be electrically coupled through wires or through electrodes and may be packaged into a single package. A semiconductor apparatus may operate by being coupled with an external device through pads. In the case where the number of chips configuring a semiconductor apparatus is small, then a loading to be coupled with a pad is not considered large and communication between an external device and the semiconductor apparatus may be performed relatively smoothly. However, as the number of chips configuring a semiconductor apparatus increases and a loading to be coupled with a pad increases, a problem may be caused whereby precise communication may not be able to be performed.

SUMMARY

In an embodiment, a semiconductor apparatus may be provided. The semiconductor apparatus may include a package substrate, and a plurality of semiconductor chips. Wherein the package substrate and the semiconductor chips may be configured based on a load value of the semiconductor apparatus.

DETAILED DESCRIPTION

Hereinafter, a semiconductor apparatus and a semiconductor system including the same will be described below with reference to the accompanying drawings through various examples of embodiments.

Figure 1A:
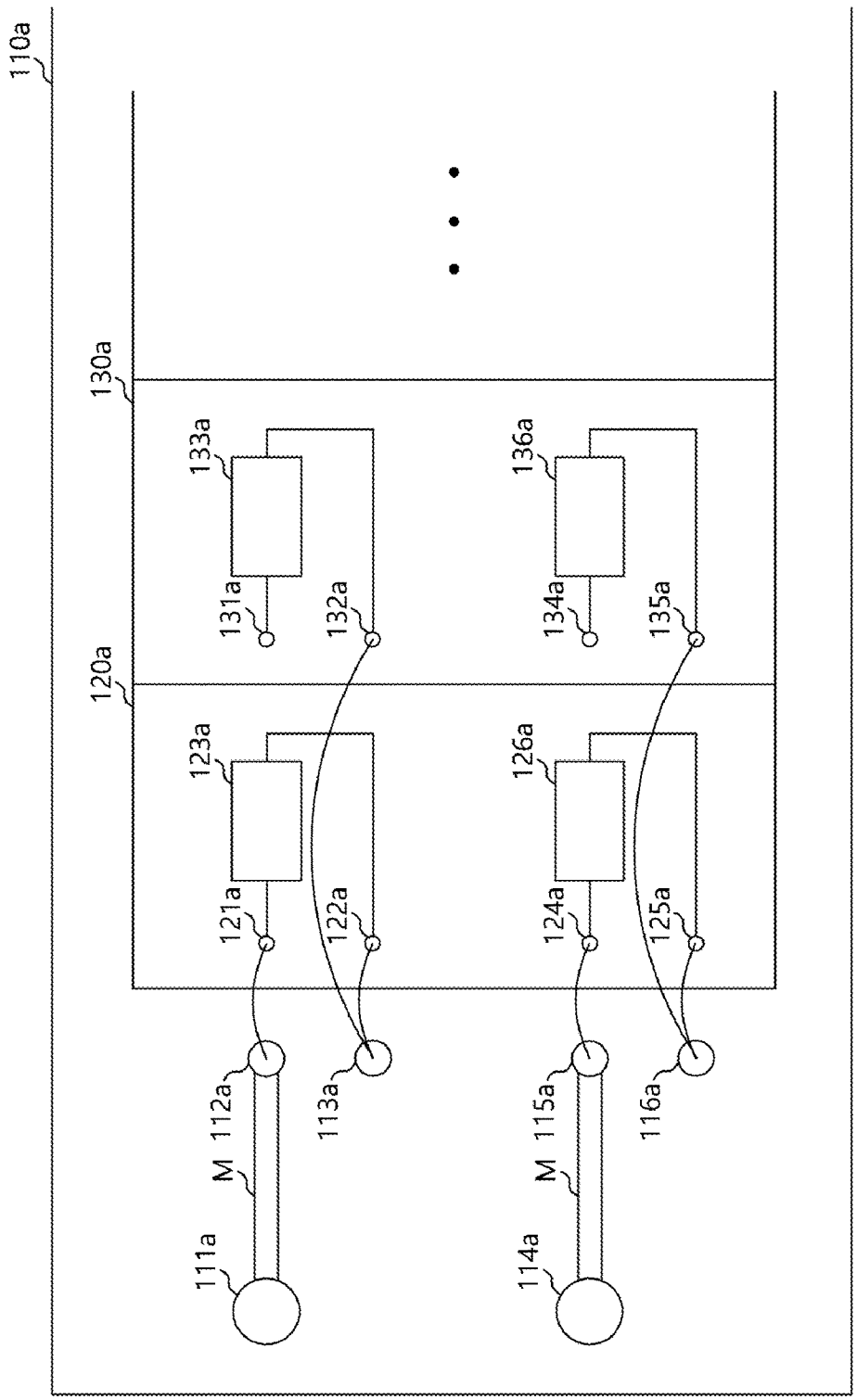
FIG. 1A is a diagram illustrating a representation of an example of the configuration of a semiconductor apparatus in accordance with an embodiment.

FIG. 1A is a diagram illustrating a representation of an example of the configuration of a semiconductor apparatus 100A in accordance with an embodiment. FIG. 1A is a plan view illustrating conceptually the configuration of a present embodiment. Referring to FIG. 1A, the semiconductor apparatus 100A may include a package substrate 110a and a first semiconductor chip 120a. The package substrate 110a may include a first package ball 111a, a first substrate pad 112a, and a second substrate pad 113a. The first package ball 111a may be coupled with an external device (not illustrated). The first substrate pad 112a may be coupled with the first package ball 111a. The first substrate pad 112a may be coupled with the first package ball 111a through electrical coupling means such as, for example but not limited to, a metal line M.

The first semiconductor chip 120a may include a first main pad 121a, a first auxiliary pad 122a, and a first buffer 123a. The first main pad 121a may be coupled with the first substrate pad 112a. The first main pad 121a may be wire-bonded with the first substrate pad 112a. The first auxiliary pad 122a may be wire-bonded with the second substrate pad 113a. In the present detailed description, "couple" may be used as a term that may include all electrical coupling relationships using bonding wires, through electrodes, through-silicon vias or the likes, and may be used as a term that includes not only a case where two components are coupled directly but also a case where two components are coupled indirectly through another component or other components. 'Wire bonding' may be used as a term that means a case where two components are coupled directly by using bonding wires. The first buffer 123a may be coupled between the first main pad 121a and the first auxiliary pad 122a. The output signal of the first buffer 123a may be provided to the internal circuit of the first semiconductor chip 120a.

The semiconductor apparatus 100a may further include a second semiconductor chip 130a. The second semiconductor chip 130a may be stacked on the first semiconductor chip 120a. The second semiconductor chip 130a may include a second auxiliary pad 132a. The second auxiliary pad 132a may be coupled with the second substrate pad 113a. The second auxiliary pad 132a may be wire-bonded with the second substrate pad 113a.

The first package ball 111a may be coupled with the first main pad 121a of the first semiconductor chip 120a through the first substrate pad 112a, and may not be coupled directly or may be indirectly coupled with the second substrate pad 113a, the first auxiliary pad 122a and the second auxiliary pad 132a. Therefore, the first package ball 111a and the first substrate pad 112a may expect only the loading of the first main pad 121a and the first buffer 123a, and the external device coupled with the first package ball 111a may expect only a loading for the first semiconductor chip 120a, If a signal is received through the first package ball 111a, the first main pad 121a may receive the signal from the first substrate pad 112a, and the first buffer 123a may buffer and output the signal. Since the output of the first buffer 123a is coupled with the first auxiliary pad 122a and the first auxiliary pad 122a is coupled with the second substrate pad 113a and the second auxiliary pad 132a, the signal buffered by the first buffer 123a may be transmitted to both the first and second semiconductor chips 120a and 130a. Conversely, a signal outputted from the internal circuit of any one of the first and second semiconductor chips 120a and 130a may be inputted to the first buffer 123a through the second substrate pad 113a and the first auxiliary pad 122a. A signal outputted from the internal circuit of the first semiconductor chip 120a may be inputted to the first buffer 123a through the first auxiliary pad 122a, and a signal outputted from the internal circuit of the second semiconductor chip 130a may be inputted to the first buffer 123a sequentially through the second auxiliary pad 132a, the second substrate pad 113a and the first auxiliary pad 122a. The first buffer 123a may buffer the signal, and output the buffered signal to the external device through the first substrate pad 112a and the first package ball 111a. The signal received or outputted through the first package ball 111a may be a bidirectional transmission signal. For example, the bidirectional transmission signal may be data or a data strobe signal. The first buffer 123a may be a bidirectional signal transmission circuit.

The second semiconductor chip 130a may further include a second main pad 131a and a second buffer 133a. The second semiconductor chip 130a may be manufactured and fabricated on substantially the same wafer as the first semiconductor chip 120a, and may have substantially the same configuration as the first semiconductor chip 120a. The second main pad 131a may be coupled with the second buffer 133a. While the second main pad 131a may be coupled with the second auxiliary pad 132a through the second buffer 132a, the second main pad 131a may not be coupled directly with the first substrate pad 112a. The second main pad 131a may not be wire-bonded with the first substrate pad 112a.

Referring to FIG. 1A, the package substrate 110a may further include a second package ball 114a, a third substrate pad 115a, and a fourth substrate pad 116a. The second package ball 114a may receive a unidirectional transmission signal, and the unidirectional transmission signal may be, for example, a command signal and/or an address signal. The third substrate pad 115a may be coupled with the second package ball 114a through electrical coupling means such as, for example but not limited to, a metal line M.

The first semiconductor chip 120a may further include a third main pad 124a, a third auxiliary pad 125a, and a third buffer 126a. The third main pad 124a may be wire-bonded with the third substrate pad 115a. The third auxiliary pad 125a may be wire-bonded with the fourth substrate pad 116a. The third buffer 126a may be coupled between the third main pad 124a and the third auxiliary pad 125a. The third buffer 126a may provide a signal received through the third main pad 124a, to the third auxiliary pad 125a and the fourth substrate pad 116a.

The second semiconductor chip 130a may further include a fourth main pad 134a, a fourth auxiliary pad 135a, and a fourth buffer 136a. The fourth auxiliary pad 135a may be wire-bonded with the fourth substrate pad 116a. Therefore, the second semiconductor chip 130a may receive a signal received through the second package ball 114a, through the third buffer 126a and the third auxiliary pad 125a of the first semiconductor chip 120a and the fourth substrate pad 116a. The fourth buffer 136a may couple the fourth main pad 134a and the fourth auxiliary pad 135a. The fourth main pad 134a may not be wire-bonded with the third substrate pad 115a.

The semiconductor apparatus 100A may further include a plurality of semiconductor chips which are stacked on the package substrate 110a and the first and second semiconductor chips 120a and 130a. The plurality of semiconductor chips may include the same configuration as the second semiconductor chip 130a, and may have the same electrical coupling relationship as the electrical coupling relationship of the components of the second semiconductor chip 130a. The semiconductor apparatus 100A in accordance with a present embodiment allows the external device to expect only the loadings of the main pads 121a and 124a and the buffers 123a and 126a of the first semiconductor chip 120a through the package balls 111a and 114a and not to expect loadings of the other semiconductor chips. Hence, even though the external device is coupled with a semiconductor apparatus in which a plurality of semiconductor chips are stacked, a loading may be reduced as if the external device is coupled with a semiconductor apparatus which includes one semiconductor chip.

A signal received from the external device may be buffered by the first buffer 123a, and the buffered signal may be transmitted to the respective semiconductor chips through the second substrate pad 113a and the auxiliary pads 122a and 132a. Conversely, a signal outputted from each semiconductor chip may be provided to the first buffer 123a through the auxiliary pads 122a and 132a and the second substrate pad 113a, and may be outputted to the external device through the first buffer 123a, the first substrate pad 112a and the first package ball 111a.

Figure 1B:
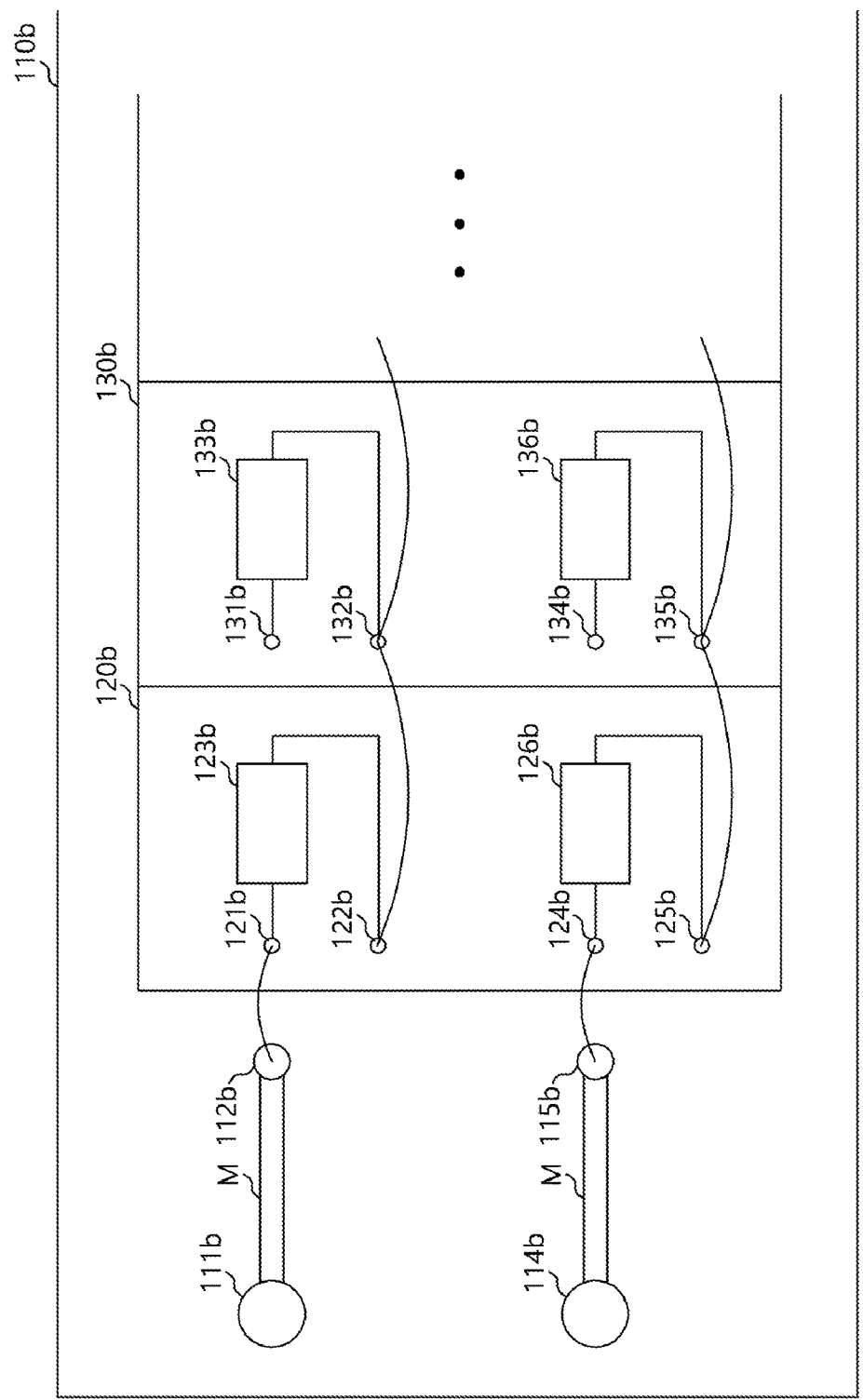
FIG. 1B is a diagram illustrating a representation of an example of the configuration of a semiconductor apparatus in accordance with an embodiment.

FIG. 1B is a diagram illustrating a representation of an example of the configuration of a semiconductor apparatus 100B in accordance with an embodiment. Referring to FIG. 1B, the semiconductor apparatus 100B may be shown in a top view which conceptually illustrates the configuration of the present embodiment. The components of the semiconductor apparatus 100B may be the same as those of the semiconductor apparatus 100A illustrated in FIG. 1A, and repeated descriptions for same configurations will be omitted herein. The semiconductor apparatus 100B may include a package substrate 110b, a first semiconductor chip 120b and a second semiconductor chip 130b.

The package substrate 110b may include a first package ball 111b, a first substrate pad 112b, a second package ball 114b and a second substrate pad 115b. Unlike the package substrate 110a shown in FIG. 1A, the package substrate 110b might not include components corresponding to the second substrate pad 113a and the fourth substrate pad 116a. Referring to FIG. 1B, a first auxiliary pad 122b of the first semiconductor chip 120b may be coupled with a second auxiliary pad 132b of the second semiconductor chip 130b.

The first auxiliary pad 122b of the first semiconductor chip 120b may be wire-bonded with the second auxiliary pad 132b of the second semiconductor chip 130b. A third auxiliary pad 125b of the first semiconductor chip 120b may be coupled with a fourth auxiliary pad 135b of the second semiconductor chip 130b. The third auxiliary pad 125b of the first semiconductor chip 120b may be wire-bonded with the fourth auxiliary pad 135b of the second semiconductor chip 130b. The semiconductor apparatus 100E may further include a plurality of semiconductor chips which are sequentially stacked on the second semiconductor chip 130b. The plurality of semiconductor chips may have substantially the same structure as the first and second semiconductor chips 120b and 130b. One auxiliary pad of a semiconductor chip which is stacked on the second semiconductor chip 130b may be coupled with the second auxiliary pad 132b of the second semiconductor chip 130b, and the other auxiliary pad of the semiconductor chip which is stacked on the second semiconductor chip 130b may be coupled with the fourth auxiliary pad 135b of the second semiconductor chip 130b. The one auxiliary pad of the semiconductor chip which is stacked on the second semiconductor chip 130b may be wire-bonded with the second auxiliary pad 132b of the second semiconductor chip 130b, and the other auxiliary pad of the semiconductor chip which is stacked on the second semiconductor chip 130b may be wire-bonded with the fourth auxiliary pad 135b of the second semiconductor chip 130b.

A signal which is received from an external device through the first package ball 111b and the first substrate pad 112b may be buffered by a first buffer 123b, and the buffered signal may be transmitted to the respective semiconductor chips through the auxiliary pads 122b and 132b. Conversely, a signal which is outputted from each semiconductor chip may be provided to the first buffer 123b through the auxiliary pads 132b and 122b, and the signal buffered by the first buffer 123b may be outputted to the external device through the first substrate pad 112b and the first package ball 111b. Similarly, a signal which is received from the external device through the second package ball 114b and the second substrate pad 115b may be buffered by a second buffer 126b, and the buffered signal may be transmitted to the respective semiconductor chips through the auxiliary pads 125b and 135b. Conversely, a signal which is outputted from each semiconductor chip may be provided to the second buffer 126b through the auxiliary pads 135b and 125b, and the signal buffered by the second buffer 126b may be outputted to the external device through the second substrate pad 115b and the second package ball 114b.

Figure 2A:
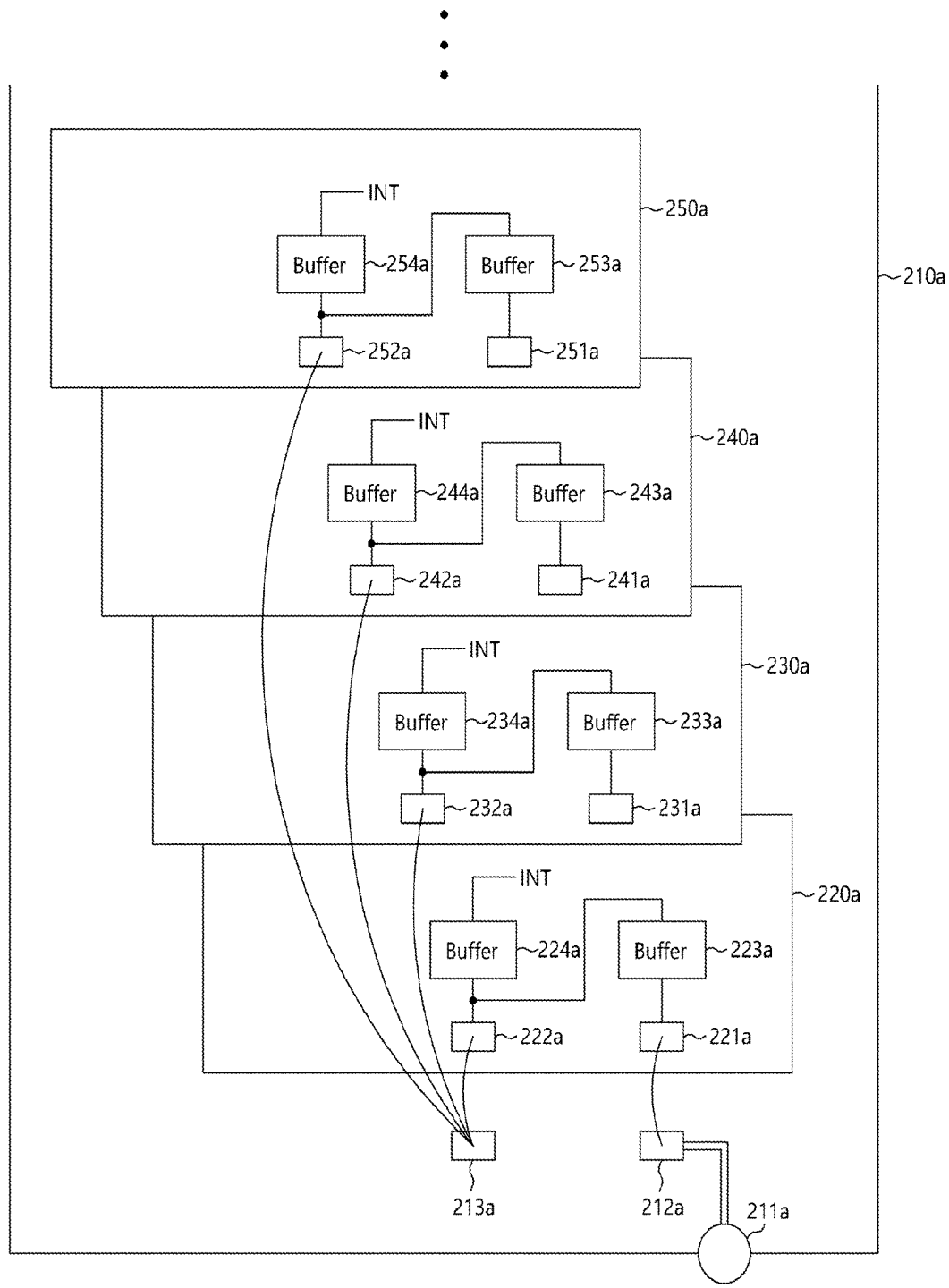
FIG. 2A is a diagram illustrating a representation of an example of the configuration of a semiconductor apparatus in accordance with an embodiment.

FIG. 2A is a diagram illustrating a representation of an example of the configuration of a semiconductor apparatus 200A in accordance with an embodiment. Referring to FIG. 2A, the semiconductor apparatus 200A may include a package substrate 210a and a plurality of semiconductor chips. Referring to FIG. 2A, it is illustrated that, without a limiting sense, first to fourth semiconductor chips 220a, 230a, 240a and 250a are stacked. However, it is to be noted that the semiconductor apparatus 200 may include a greater number of semiconductor chips. The package substrate 210a may include a package ball 211a, a first substrate pad 212a, and a second substrate pad 213a. The first substrate pad 212a may be coupled with the package ball 211a, and the package ball 211a may be coupled with an external device (not illustrated). The first semiconductor chip 220a may include a first main pad 221a, a first auxiliary pad 222a, a first buffer 223a, and a second buffer 224a. The first main pad 221a may be wire-bonded with the first substrate pad 212a. The first auxiliary pad 222a may be wire-bonded with the second substrate pad 213a. The first buffer 223a may be coupled between the first main pad 221a and the first auxiliary pad 222a. The second buffer 224a may be coupled with the first auxiliary pad 222a and the first buffer 223a. The second buffer 224a may be coupled also with an internal circuit INT of the first semiconductor chip 220a.

The second semiconductor chip 230a may include a second main pad 231a, a second auxiliary pad 232a, a third buffer 233a, and a fourth buffer 234a. In order for implementation of a present embodiment, it is sufficient that the second semiconductor chip 230a includes the second auxiliary pad 232a and the fourth buffer 234a. Since the first to fourth semiconductor chips 220a, 230a, 240a and 250a may be manufactured and fabricated through the same processes and have the same configuration, it is illustrated that the second semiconductor chip 230a includes together the configuration of the second main pad 231a and the third buffer 233a. The second main pad 231a may not be coupled directly with the first substrate pad 212a. That is to say, the second main pad 231a may not be wire-bonded with the first substrate pad 212a. The second auxiliary pad 232a may be wire-bonded with the second substrate pad 213a. The third buffer 233a may be coupled between the second main pad 231a and the second auxiliary pad 232a. The fourth buffer 234a may be coupled with the second auxiliary pad 232a and the third buffer 233a. The fourth buffer 234a may be coupled also with an internal circuit INT of the second semiconductor chip 230a.

The third semiconductor chip 240a may include a third main pad 241a, a third auxiliary pad 242a, a fifth buffer 243a, and a sixth buffer 244a. In order for implementation of a present embodiment, it is sufficient that the third semiconductor chip 240a includes the third auxiliary pad 242a and the sixth buffer 244a. Since the first to fourth semiconductor chips 220a, 230a, 240a and 250a may be manufactured and fabricated through the same processes and have the same configuration, it is illustrated that the third semiconductor chip 240a includes together the configuration of the third main pad 241a and the fifth buffer 243a. The third main pad 241a may not be coupled directly with the first substrate pad 212a. That is to say, the third main pad 241a may not be wire-bonded with the first substrate pad 212a. The third auxiliary pad 242a may be wire-bonded with the second substrate pad 213a. The fifth buffer 243a may be coupled between the third main pad 241a and the third auxiliary pad 242a. The sixth buffer 244a may be coupled with the third auxiliary pad 242a and the fifth buffer 243a. The sixth buffer 244a may be coupled also with an internal circuit INT of the third semiconductor chip 240a.

The fourth semiconductor chip 250a may include a fourth main pad 251a, a fourth auxiliary pad 252a, a seventh buffer 253a, and an eighth buffer 254a. In order for implementation of a present embodiment, it is sufficient that the fourth semiconductor chip 250a includes the fourth auxiliary pad 252a and the eighth buffer 254a. Since the first to fourth semiconductor chips 220a, 230a, 240a and 250a may be manufactured and fabricated through the same processes and have the same configuration, it is illustrated that the fourth semiconductor chip 250a includes together the configuration of the fourth main pad 251a and the seventh buffer 253a. The fourth main pad 251a may not be coupled directly with the first substrate pad 212a. That is to say, the fourth main pad 251a may not be wire-bonded with the first substrate pad 212a. The fourth auxiliary pad 252a may be wire-bonded with the second substrate pad 213a. The seventh buffer 253a may be coupled between the fourth main pad 251a and the fourth auxiliary pad 252a. The eighth buffer 254a may be coupled with the fourth auxiliary pad 252a and the seventh buffer 253a. The eighth buffer 254a may be coupled also with an internal circuit INT of the fourth semiconductor chip 250a.

In the case where the package ball 211a receives and outputs a bidirectional transmission signal, the first to eighth buffers 223a, 224a, 233a, 234a, 243a, 244a, 253a and 254a may be bidirectional transmission circuits. For example, the first to eighth buffers 223a, 224a, 233a, 234a, 243a, 244a, 253a and 254a may include transmitters and receivers. In the case where the package ball 211a receives a unidirectional transmission signal, the first to eighth buffers 223a, 224a, 233a, 234a, 243a, 244a, 253a and 254a may be unidirectional transmission circuits. For example, the first to eighth buffers 223a, 224a, 233a, 234a, 243a, 244a, 253a and 254a may include only receivers.

Operations in the case where the semiconductor apparatus 200A receives and outputs a bidirectional transmission signal will be described below. The semiconductor apparatus 200A may receive a signal through the package ball 211a from the external device. The signal may be inputted to the first buffer 223a through the first substrate pad 212a and the first main pad 221a, and the first buffer 223a may buffer the signal and output the buffered signal to the second buffer 224a and the first auxiliary pad 222a. The second buffer 224a may buffer the signal outputted from the first buffer 223a, and provide the buffered signal to the internal circuit INT of the first semiconductor chip 220a. Further, the signal outputted from the first buffer 223a may be provided to the fourth buffer 234a, the sixth buffer 244a and the eighth buffer 254a through the first auxiliary pad 222a, the second substrate pad 213a and the second to fourth auxiliary pads 232a, 242a and 252a. The fourth buffer 234a may buffer the signal outputted from the first buffer 223a through the second substrate pad 213a and the second auxiliary pad 232a, and provide the buffered signal to the internal circuit INT of the second semiconductor chip 230a. The sixth buffer 244a may buffer the signal outputted from the first buffer 223a through the second substrate pad 213a and the third auxiliary pad 242a, and provide the buffered signal to the internal circuit INT of the third semiconductor chip 240a. The eighth buffer 254a may buffer the signal outputted from the first buffer 223a through the second substrate pad 213a and the fourth auxiliary pad 252a, and provide the buffered signal to the internal circuit INT of the fourth semiconductor chip 250a.

The first buffer 223a may buffer the signal received from the external device, and transmit the buffered signal to the first to fourth semiconductor chips 220a, 230a, 240a and 250a. Accordingly, signal transmission and/or reception between the semiconductor apparatus 200A and the external device may be performed through the first substrate pad 212a, the first main pad 221a and the first buffer 223a, and signal transmission and/or reception in the semiconductor apparatus 200A may be performed through the second substrate pad 213a and the respective auxiliary pads 222a, 232a, 242a and 252a. Since the semiconductor apparatus 200A is coupled directly with the external device only through the first main pad 221a and the first buffer 223a, a loading which the external device expects for the semiconductor apparatus 200A may be retained as a constant value even though the number of semiconductor chips included in the semiconductor apparatus 200A is increased.

A signal outputted from the internal circuit INT of the first semiconductor chip 220a may be buffered by the second buffer 224a, and the buffered signal may be outputted to the first buffer 223a. The first buffer 223a may buffer the signal received from the second buffer 224a, and output the buffered signal to the first substrate pad 212a and the package ball 211a through the first main pad 221a. Signals outputted from the internal circuits INT of the second to fourth semiconductor chips 230a, 240a and 250a may be buffered by the fourth buffer 234a, the sixth buffer 244a and the eighth buffer 254a, and the buffered signals may be transmitted to the second substrate pad 213a through the second auxiliary pad 232a, the third auxiliary pad 242a and the fourth auxiliary pad 252a, respectively. The signals transmitted to the second substrate pad 213a may be inputted to the first buffer 223a through the first auxiliary pad 222a. The first buffer 223a may buffer the signals received through the first auxiliary pad 222a, and the buffered signals may be outputted to the first substrate pad 212a and the package ball 211a through the first main pad 221a. Accordingly, the signals outputted from the internal circuits INT of the first to fourth semiconductor chips 220a, 230a, 240a and 250a may be buffered by the first buffer 223a, and may be outputted to the external device sequentially through the first main pad 221a, the first substrate pad 212a and the package ball 211a.

Figure 2B:
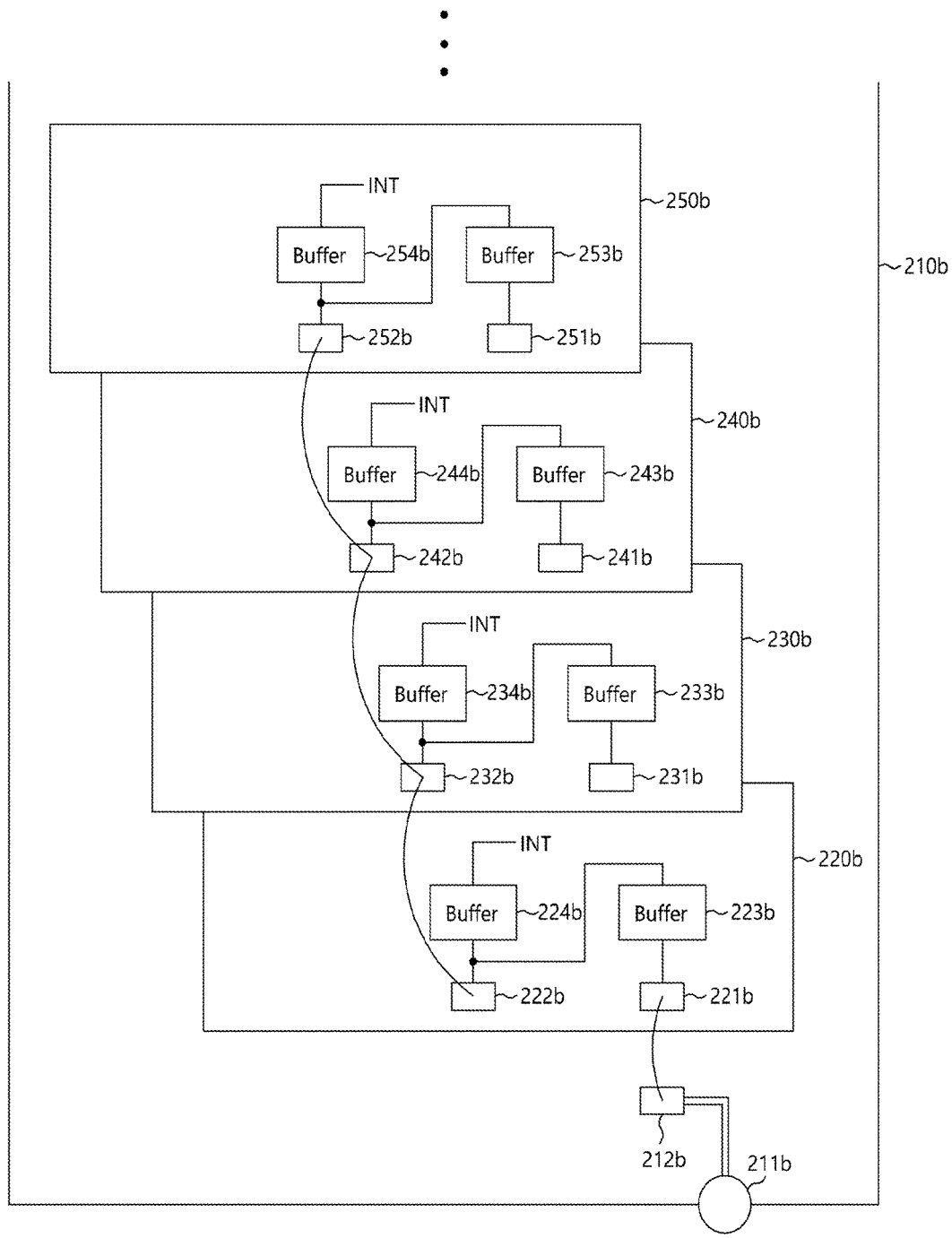
FIG. 2B is a diagram illustrating a representation of an example of the configuration of a semiconductor apparatus in accordance with an embodiment.

FIG. 2B is a diagram illustrating a representation of an example of the configuration of a semiconductor apparatus 200B in accordance with an embodiment. Referring to FIG. 2B, the components of the semiconductor apparatus 200B may be the same as those of the semiconductor apparatus 200A illustrated in FIG. 2A, and repeated descriptions for same configurations will be omitted herein. The semiconductor apparatus 200B may include a package substrate 210b, a first semiconductor chip 220b, a second semiconductor chip 230b, a third semiconductor chip 240b, and a fourth semiconductor chips 250b.

The package substrate 210b may include a package ball 211b and a substrate pad 212b. Unlike the package substrate 210a shown in FIG. 2A, the package substrate 210b might not include a component corresponding to the second substrate pad 213a. Referring to FIG. 2B, the auxiliary pads of adjacent semiconductor chips among the first to fourth semiconductor chips 220b, 230b, 240b and 250b may be coupled with each other. The auxiliary pads of adjacent semiconductor chips among the first to fourth semiconductor chips 220b, 230b, 240b and 250b may be wire-bonded with each other. A first auxiliary pad 222b of the first semiconductor chip 220b may be coupled with a second auxiliary pad 232b of the second semiconductor chip 230b. The first auxiliary pad 222b of the first semiconductor chip 220b may be wire-bonded with the second auxiliary pad 232b of the second semiconductor chip 230b. The second auxiliary pad 232b of the second semiconductor chip 230b may be coupled with a third auxiliary pad 242b of the third semiconductor chip 240b. The second auxiliary pad 232b of the second semiconductor chip 230b may be wire-bonded with the third auxiliary pad 242b of the third semiconductor chip 240b. The third auxiliary pad 242b of the third semiconductor chip 240b may be coupled with a fourth auxiliary pad 252b of the fourth semiconductor chip 250b. The third auxiliary pad 242b of the third semiconductor chip 240b may be wire-bonded with the fourth auxiliary pad 252b of the fourth semiconductor chip 250b.

The semiconductor apparatus 200B may receive a signal through the package ball 211b from an external device. The received signal may be inputted to a first buffer 223b through the substrate pad 212b and a first main pad 221b, The first buffer 223b may buffer the signal, and output the buffered signal to the first auxiliary pad 222b. The first semiconductor chip 220b may receive the signal outputted from the first buffer 223b, through a second buffer 224b. The second buffer 224b may buffer the signal outputted from the first buffer 223b, and provide the buffered signal to an internal circuit INT of the first semiconductor chip 220b. The signal outputted from the first buffer 223b may be provided to the second semiconductor chip 230b through the first auxiliary pad 222b and the second auxiliary pad 232b. A fourth buffer 234b may buffer the signal received through the second auxiliary pad 232b, and provide the buffered signal to an internal circuit INT of the second semiconductor chip 230b. The signal outputted from the first buffer 223b may be provided to the third semiconductor chip 240b sequentially through the first auxiliary pad 222b, the second auxiliary pad 232b and the third auxiliary pad 242b, A sixth buffer 244b may buffer the signal received through the third auxiliary pad 242b, and provide the buffered signal to an internal circuit INT of the third semiconductor chip 240b. The signal outputted from the first buffer 223b may be provided to the fourth semiconductor chip 250b sequentially through the first auxiliary pad 222b, the second auxiliary pad 232b, the third auxiliary pad 242b and the fourth auxiliary pad 252b. An eighth buffer 254b may buffer the signal received through the fourth auxiliary pad 252b, and provide the buffered signal to an internal circuit INT of the fourth semiconductor chip 250b.

A signal which is outputted from the internal circuit INT of the first semiconductor chip 220b may be buffered by the second buffer 224b, and the buffered signal may be outputted to the first buffer 223b. The first buffer 223b may buffer the signal received from the second buffer 224b, and output the buffered signal to the substrate pad 212b and the package ball 211b through the first main pad 221b. A signal which is outputted from the internal circuit INT of the second semiconductor chip 230b may be buffered by the fourth buffer 234b, and the buffered signal may be transmitted sequentially through the second auxiliary pad 232b and the first auxiliary pad 222b. The first buffer 223b may buffer the signal received through the first auxiliary pad 222b, and output the buffered signal to the substrate pad 212b and the package ball 211b through the first main pad 221b. A signal which is outputted from the internal circuit INT of the third semiconductor chip 240b may be buffered by the sixth buffer 244b, and the buffered signal may be transmitted sequentially through the third auxiliary pad 242b, the second auxiliary pad 232b and the first auxiliary pad 222b. The first buffer 223b may buffer the signal received through the first auxiliary pad 222b, and output the buffered signal to the substrate pad 212b and the package ball 211b through the first main pad 221b. A signal which is outputted from the internal circuit INT of the fourth semiconductor chip 250b may be buffered by the eighth buffer 254b, and the buffered signal may be transmitted sequentially through the fourth auxiliary pad 252b, the third auxiliary pad 242b, the second auxiliary pad 232b and the first auxiliary pad 222b. The first buffer 223b may buffer the signal received through the first auxiliary pad 222b, and output the buffered signal to the substrate pad 212b and the package ball 211b through the first main pad 221b.

Figure 3A:
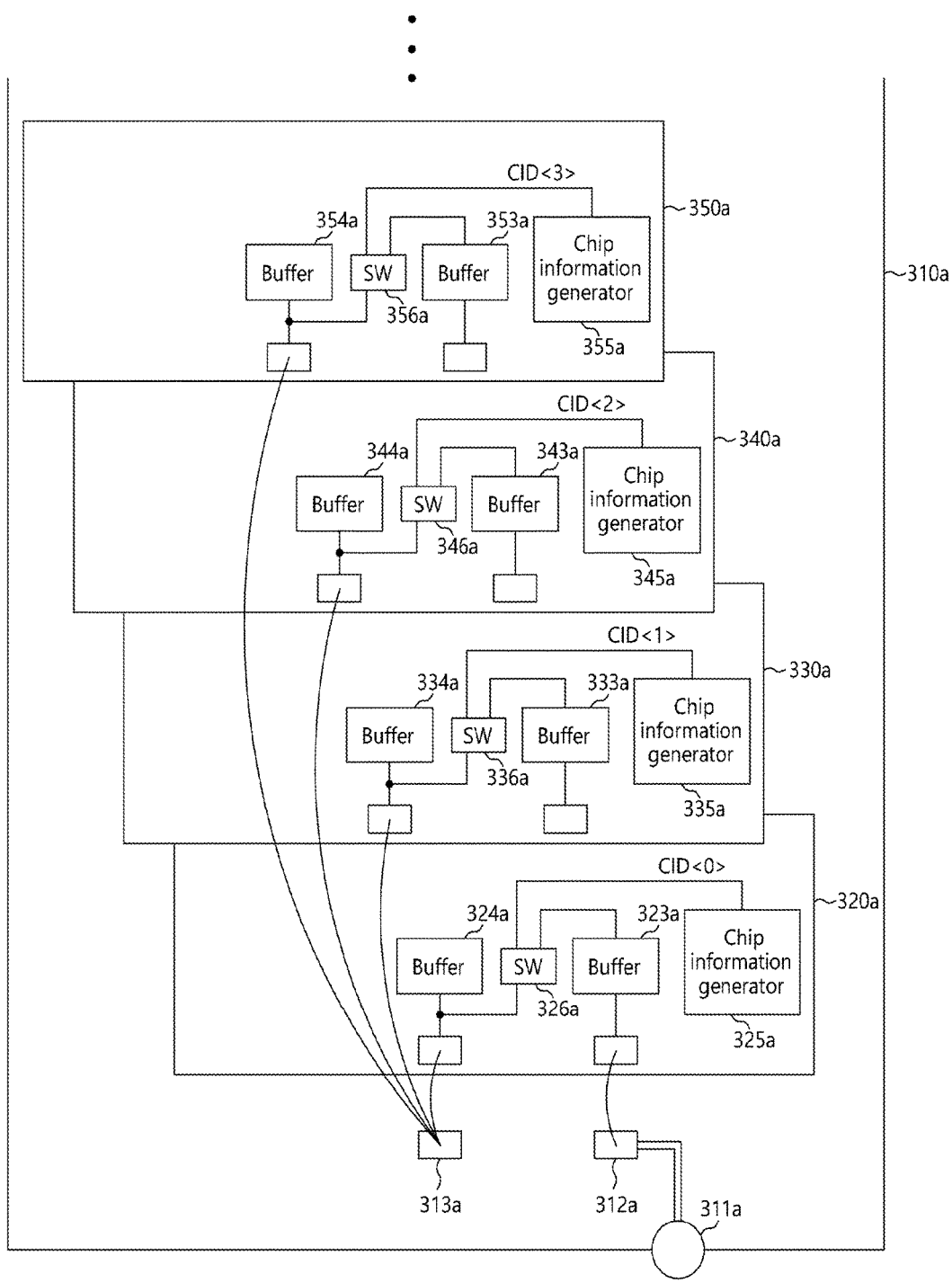
FIG. 3A is a diagram illustrating a representation of an example of the configuration of a semiconductor apparatus in accordance with an embodiment.

FIG. 3A is a diagram illustrating a representation of an example of the configuration of a semiconductor apparatus 300A in accordance with an embodiment. Referring to FIG. 3A, the semiconductor apparatus 300A may include all the components of the semiconductor apparatus 200A illustrated in FIG. 2A. Referring to FIG. 3A, descriptions for components which overlap with the components of the semiconductor apparatus 200A illustrated in FIG. 2A will be omitted, and descriptions will be made for added components. Referring to FIG. 3A, the components the same as or similar to the components of the semiconductor apparatus 200A illustrated in FIG. 2A are designated by similar reference numerals. Referring to FIG. 3A, first to fourth semiconductor chips 320a, 330a, 340a and 350a may include chip information generators 325a, 335a, 345a and 355a and switches 326a, 336a, 346a and 356a, respectively. The chip information generators 325a, 335a, 345a and 355a may generate and store different chip ID signals CID<0>, CID<1>, CID<2> and CID<3>. For example, the chip information generators 325a, 335a, 345a and 355a may generate different chip ID signals by being coupled with a plurality of power supply voltage pads. For example, when the semiconductor apparatus 300 includes the 4 semiconductor chips 320a, 330a, 340a and 350a, the respective chip information generators 325a, 335a, 345a and 355a may be coupled with 2 power supply voltage pads (not illustrated) in different coupling patterns. The chip information generator 325a of the first semiconductor chip 320a may be wire-bonded with low voltage pads, and store a code of 0,0 as the chip ID signal CID<0> of the first semiconductor chip 320a. The chip information generator 335a of the second semiconductor chip 330a may be wire-bonded with one low voltage pad and one high voltage pad, and store a code of 0,1 as the chip ID signal CID<1> of the second semiconductor chip 330a. The chip information generator 345a of the third semiconductor chip 340a may be wire-bonded with one high voltage pad and one low voltage pad, and store a code of 1,0 as the chip ID signal CID<2> of the third semiconductor chip 340a. The chip information generator 355a of the fourth semiconductor chip 350a may be wire-bonded with high voltage pads, and store a code of 1,1 as the chip ID signal CID<3> of the fourth semiconductor chip 350a.

The switch 326a may selectively couple a first buffer 323a and a second buffer 324a based on the chip ID signal CID<0> of the first semiconductor chip 320a generated from the chip information generator 325a. The switch 336a may selectively couple a third buffer 333a and a fourth buffer 334a based on the chip ID signal CID<1> of the second semiconductor chip 330a generated from the chip information generator 335a. The switch 346a may selectively couple a fifth buffer 343a and a sixth buffer 344a based on the chip ID signal CID<2> of the third semiconductor chip 340a generated from the chip information generator 345a. The switch 356a may selectively couple a seventh buffer 355a and an eighth buffer 354a based on the chip ID signal CID<3> of the fourth semiconductor chip 350a generated from the chip information generator 355a. In a present embodiment, the switch 326a of the first semiconductor chip 320 which is coupled with a first substrate pad 312a may be turned on, and the switches 336a, 346a and 356a of the second to fourth semiconductor chips 330a, 340a and 350a which are not coupled directly with the first substrate pad 312a may be turned off. For example, the switches 326a, 336a, 346a and 356a may be turned on by only a chip ID signal associated with a semiconductor chip coupled directly with the first substrate pad 312a. For example, all of the switches 326a, 336a, 346a and 356a may be turned on in response to only the code of 0,0. Therefore, the switch 326a of the first semiconductor chip 320a may be turned on, and the signal outputted from the first buffer 323a may be transmitted to the second to fourth semiconductor chips 330a, 340a and 350a through a second substrate pad 313a. All of the switches 336a, 346a and 356a of the second to fourth semiconductor chips 330a, 340a and 350a may be turned off, thereby blocking the third and fourth buffers 333a and 334a from each other, the fifth and sixth buffers 343a and 344a from each other and the seventh and eighth buffers 353a and 354a from each other. Therefore, an unnecessary loading which is likely to be added as the third buffer 333a, the fifth buffer 343a and the seventh buffer 353a are coupled with the second substrate pad 313a may be decreased additionally.

Figure 3B:
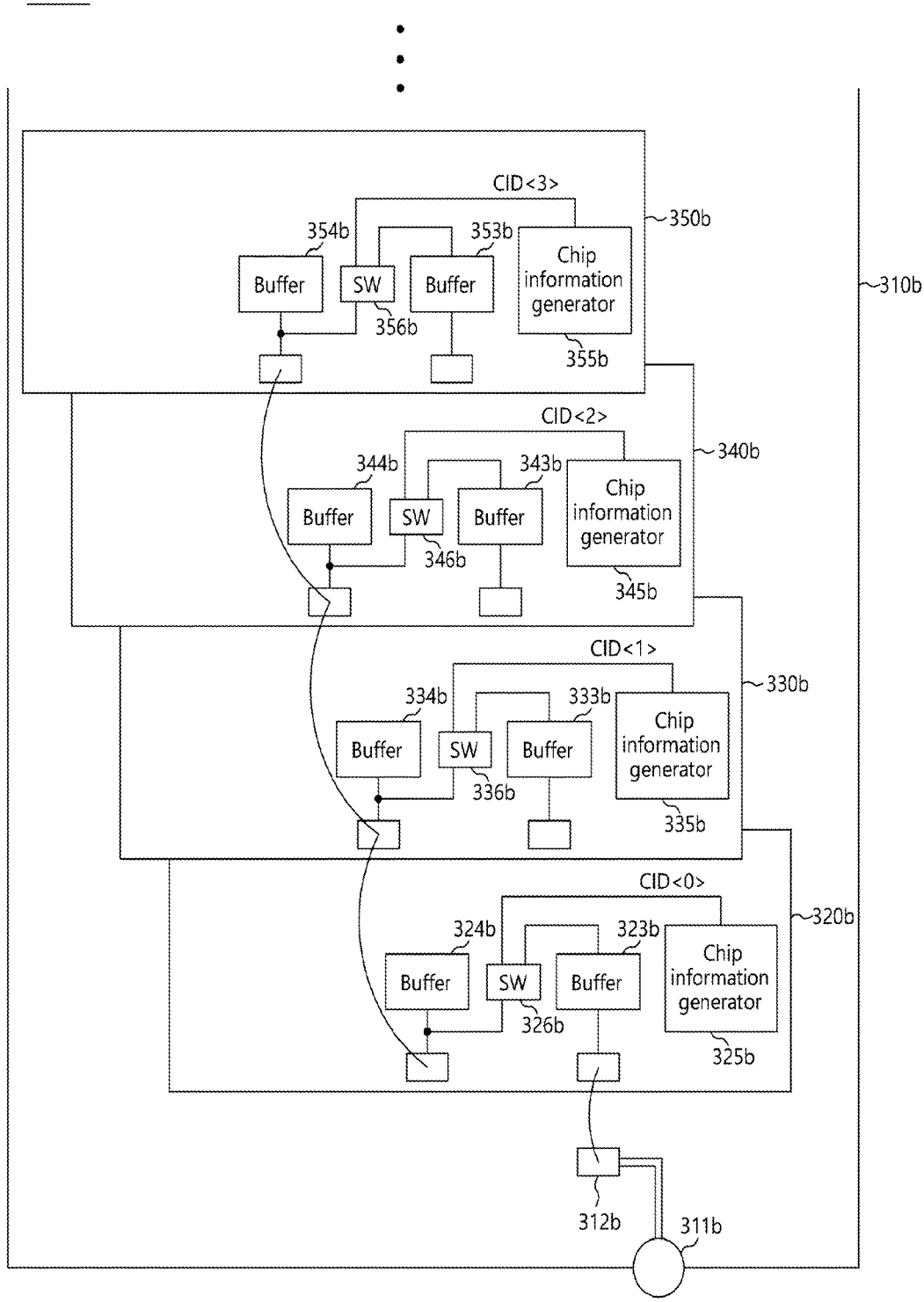
FIG. 3B is a diagram illustrating a representation of an example of the configuration of a semiconductor apparatus in accordance with an embodiment.

FIG. 3B is a diagram illustrating a representation of an example of the configuration of a semiconductor apparatus 300B in accordance with an embodiment. Referring to FIG. 3B, the components of the semiconductor apparatus 300B may be the same as those of the semiconductor apparatus 300A illustrated in FIG. 3A, and repeated descriptions for same configurations will be omitted herein. The semiconductor apparatus 300B may include a package substrate 310b and a first semiconductor chip 320b, a second semiconductor chip 330b, a third semiconductor chip 340b, and a fourth semiconductor chip 350b.

The package substrate 310b may include a package ball 311b and a substrate pad 312b. Unlike the package substrate 310a shown in FIG. 3A, the package substrate 310b might not include a component corresponding to the second substrate pad 313a. Referring to FIG. 3B, the auxiliary pads of adjacent semiconductor chips among the first to fourth semiconductor chips 320b, 330b, 340b and 350b may be wire-bonded with each other. A first auxiliary pad 322b of the first semiconductor chip 320b may be coupled with a second auxiliary pad 332b of the second semiconductor chip 330b. The first auxiliary pad 322b of the first semiconductor chip 320b may be wire-bonded with the second auxiliary pad 332b of the second semiconductor chip 330b. The second auxiliary pad 332b of the second semiconductor chip 330b may be coupled with a third auxiliary pad 342b of the third semiconductor chip 340b. The second auxiliary pad 332b of the second semiconductor chip 330b may be wire-bonded with the third auxiliary pad 342b of the third semiconductor chip 340b. The third auxiliary pad 342b of the third semiconductor chip 340b may be coupled with a fourth auxiliary pad 352b of the fourth semiconductor chip 350b. The third auxiliary pad 342b of the third semiconductor chip 340b may be wire-bonded with the fourth auxiliary pad 352b of the fourth semiconductor chip 350b.

Figure 4A:
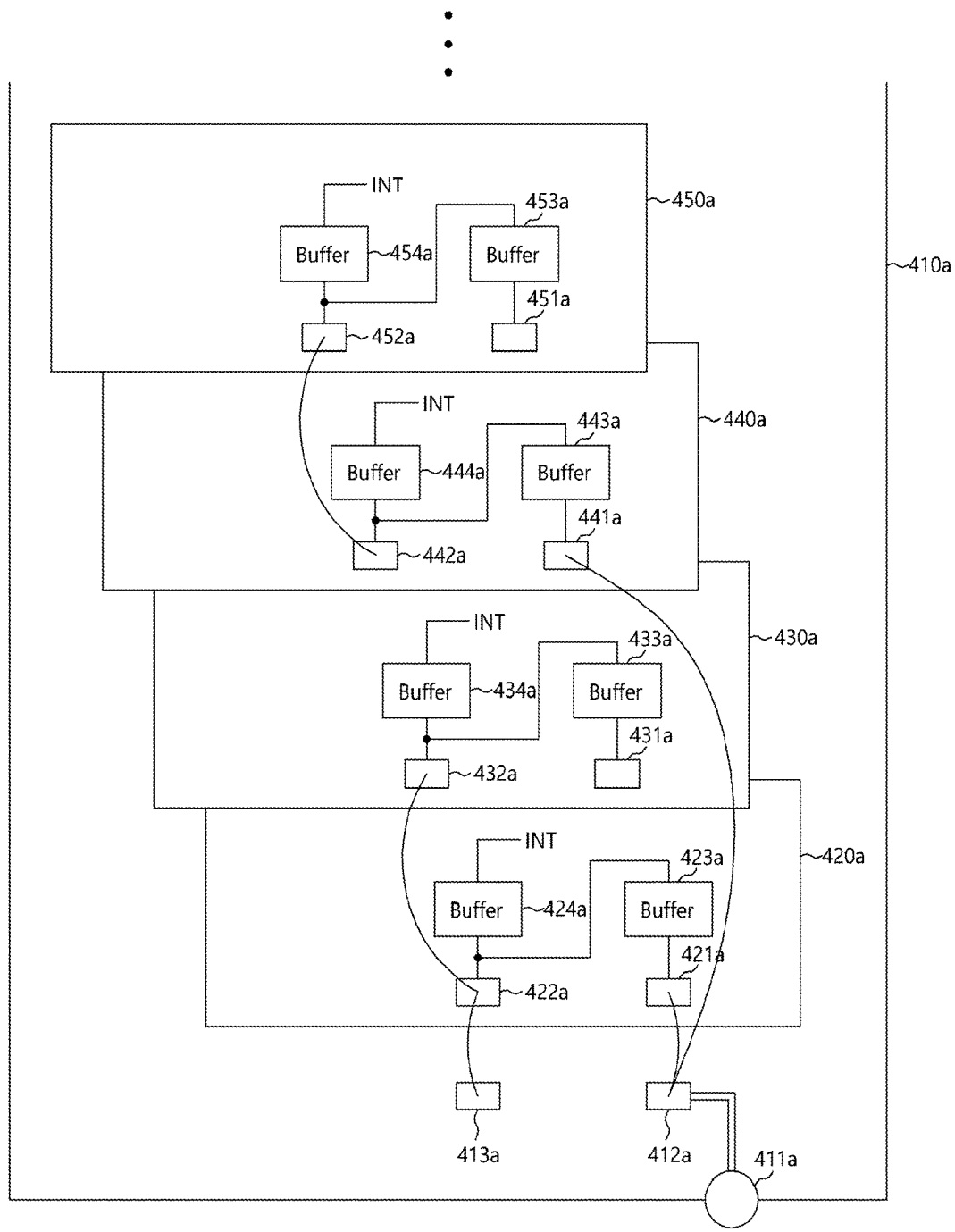
FIG. 4A is a diagram illustrating a representation of an example of the configuration of a semiconductor apparatus in accordance with an embodiment.

FIG. 4A is a diagram illustrating a representation of an example of the configuration of a semiconductor apparatus 400A in accordance with an embodiment. Referring to FIG. 4A, the semiconductor apparatus 400A may include a package substrate 410a and a first semiconductor chip 420a. Referring to FIG. 4A, reference numerals similar to FIG. 2A may designate components the same or similar to the components of the semiconductor apparatus 200A illustrated in FIG. 2A, and repeated descriptions will be omitted herein. The package substrate 410a may include a package ball 411a, a first substrate pad 412a, and a second substrate pad 413a. The first semiconductor chip 420a may be stacked on the package substrate 410a. The first semiconductor chip 420a may include a main pad 421a, an auxiliary pad 422a, a first buffer 423a, and a second buffer 424a. The main pad 421a may be wire-bonded with the first substrate pad 412a, and the auxiliary pad 422a may be wire-bonded with the second substrate pad 413a. The first buffer 423a may be coupled between the main pad 421a and the second buffer 424a. The second buffer 424a may be coupled with the first buffer 423a and the auxiliary pad 422a, and may be coupled also with an internal circuit INT of the first semiconductor chip 420a.

The semiconductor apparatus 400a may further include a plurality of semiconductor chips which are sequentially stacked on the first semiconductor chip 420a. The plurality of semiconductor chips may include substantially the same components as the first semiconductor chip 420a. The first semiconductor chip 420a and the plurality of semiconductor chips may be classified into a predetermined number of groups. For example, the number of groups may be n (n is an integer equal to or greater than 2). In a present embodiment, the main pad of at least one semiconductor chip of each group is wire-bonded with the first substrate pad 412a, the auxiliary pad of the at least one semiconductor chip of each group is wire-bonded with the second substrate pad 413a, and the auxiliary pads of the semiconductor chips of each group may be wire-bonded with each other. The main pad of a remaining semiconductor chip of each group may not be wire-bonded with the first substrate pad 412a. The auxiliary pad of the remaining semiconductor chip of each group may not be wire-bonded with the second substrate pad 413a.

Referring to FIG. 4A, the semiconductor apparatus 400A may further include second to fourth semiconductor chips 430a, 440a and 450a. The first and second semiconductor chips 420a and 430a may be classified into a first group, and the third and fourth semiconductor chips 440a and 450a may be classified into a second group. In the first group, the main pad 421a of the first semiconductor chip 420a may be wire-bonded with the first substrate pad 412a, and the auxiliary pad 422a of the first semiconductor chip 420a may be wire-bonded with the second substrate pad 413a. The main pad 431a of the second semiconductor chip 430a may not be wire-bonded with the first substrate pad 412a and the main pad 421a of the first semiconductor chip 420a, and the auxiliary pad 432a of the second semiconductor chip 430a may be wire-bonded with the auxiliary pad 422a of the first semiconductor chip 420a. In the second group, the main pad 441a of the third semiconductor chip 440a may be wire-bonded with the first substrate pad 412a, and the auxiliary pad 442a of the third semiconductor chip 440a may not be wire-bonded with the second substrate pad 413a. The main pad 451a of the fourth semiconductor chip 450a may not be wire-bonded with the first substrate pad 412a and the main pad 441a of the third semiconductor chip 440a, and the auxiliary pad 452a of the fourth semiconductor chip 450a may be wire-bonded with the auxiliary pad 442a of the third semiconductor chip 440a.

The main pad 421a of the first semiconductor chip 420a and the main pad 441a of the third semiconductor chip 440a may be respectively wire-bonded with the first substrate pad 412a, and receive a signal transmitted from an external device (not illustrated), through the package ball 411a. The buffer 423a of the first semiconductor chip 420a may buffer the signal received through the main pad 421a and provide the buffered signal to the auxiliary pad 422a such that the signal may be provided to not only the first semiconductor chip 420a but also the second semiconductor chip 430a. A buffer 443a of the third semiconductor chip 440a may buffer the signal received through the main pad 441a and provide the buffered signal to the auxiliary pad 442a such that the signal may be provided to not only the third semiconductor chip 440a but also the fourth semiconductor chip 450a. In a present embodiment, a loading which the external device expects for the semiconductor apparatus 400a may be a loading corresponding to 2 semiconductor chips (that is, the first semiconductor chip 420a and the third semiconductor chip 440a). However, a loading which the buffer 423a and the auxiliary pad 422a of the first semiconductor chip 420a expect may be reduced to one half when compared to the cases of the semiconductor apparatuses 200A and 300A of FIGS. 2A and 3A. Therefore, no limitation may exist when designing the buffer 423a of the first semiconductor chip 420a, and signal transmission may be precisely implemented in the semiconductor apparatus 400A.

Figure 4B:
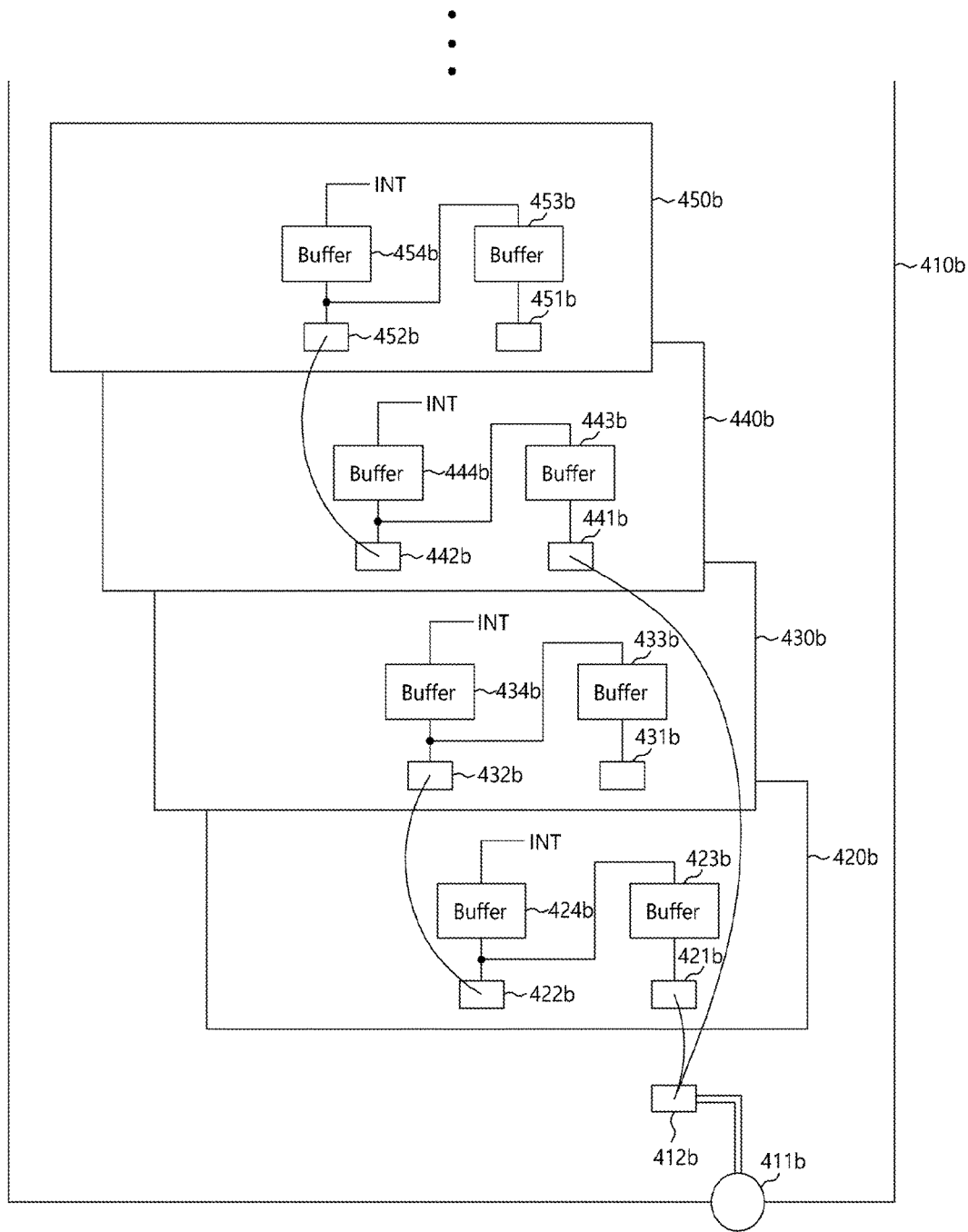
FIG. 4B is a diagram illustrating a representation of an example of the configuration of a semiconductor apparatus in accordance with an embodiment.

FIG. 4B is a diagram illustrating a representation of an example of the configuration of a semiconductor apparatus 400B in accordance with an embodiment. Referring to FIG. 4B, the components of the semiconductor apparatus 400B may be the same as those of the semiconductor apparatus 400A illustrated in FIG. 4A, and repeated descriptions for same configurations will be omitted herein. The semiconductor apparatus 400B may include a package substrate 410b, a first semiconductor chip 420b, a second semiconductor chip 430b, a third semiconductor chip 440b, and a fourth semiconductor chip 450b.

The package substrate 410b may include a package ball 411b and a substrate pad 412b. Unlike the package substrate 410a shown in FIG. 4A, the package substrate 410b might not include a component corresponding to the second substrate pad 413a. Referring to FIG. 4B, the auxiliary pads of adjacent semiconductor chips in each group may be coupled with each other. The auxiliary pads of adjacent semiconductor chips in each group may be wire-bonded with each other. For example, the auxiliary pads of the first and second semiconductor chips 420b and 430b which are classified into a first group may be wire-bonded with each other, and the auxiliary pads of the third and fourth semiconductor chips 440b and 450b which are classified into a second group may be wire-bonded with each other. A first auxiliary pad 422b of the first semiconductor chip 420b may be coupled with a second auxiliary pad 432b of the second semiconductor chip 430b. The first auxiliary pad 422b of the first semiconductor chip 420b may be wire-bonded with the second auxiliary pad 432b of the second semiconductor chip 430b. A third auxiliary pad 442b of the third semiconductor chip 440b may be coupled with a fourth auxiliary pad 452b of the fourth semiconductor chip 450b. The third auxiliary pad 442b of the third semiconductor chip 440b may be wire-bonded with the fourth auxiliary pad 452b of the fourth semiconductor chip 450b.

Figure 5:
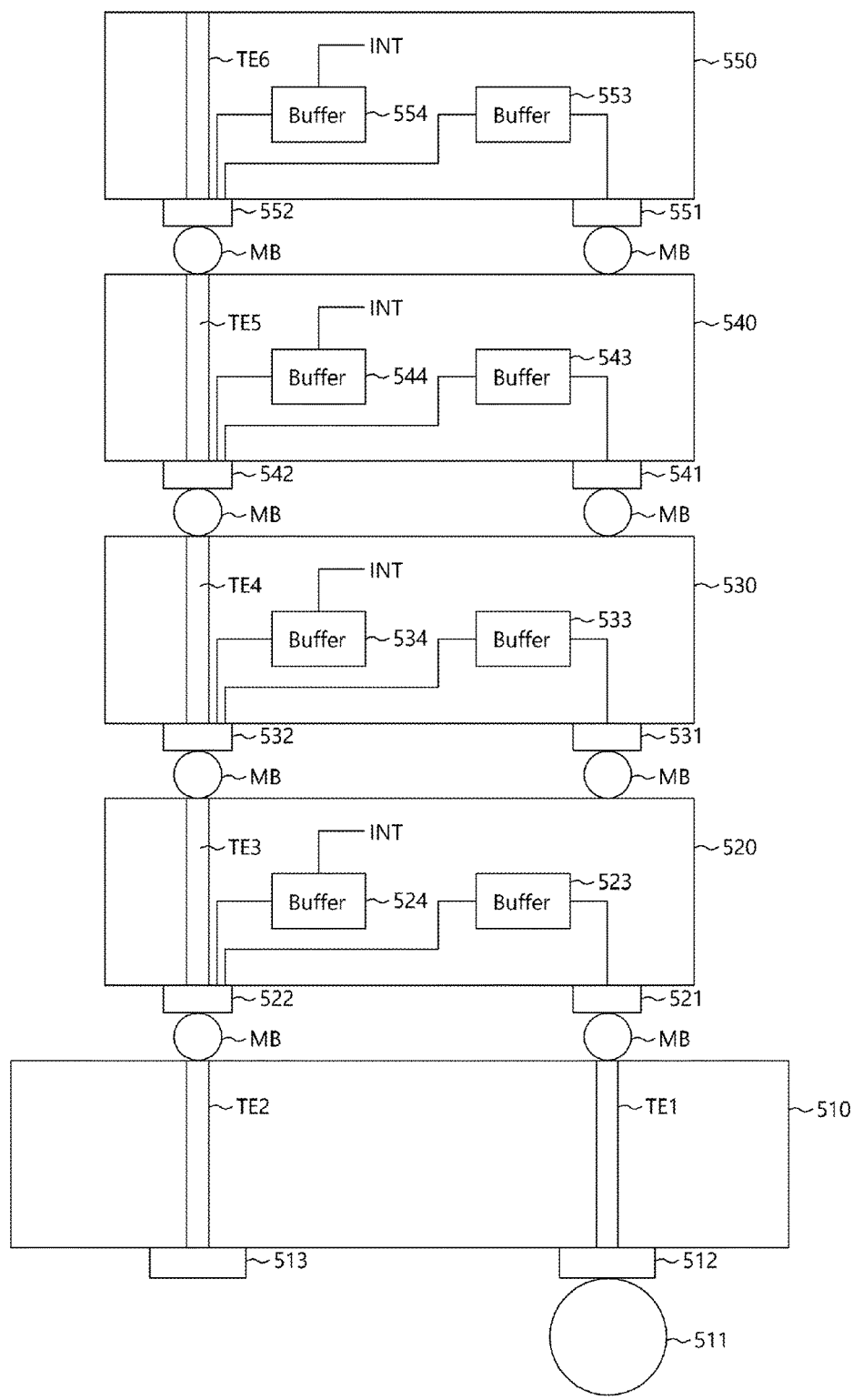
FIG. 5 is a diagram illustrating a representation of an example of the configuration of a semiconductor apparatus in accordance with an embodiment.

FIG. 5 is a diagram illustrating a representation of an example of the configuration of a semiconductor apparatus 500 in accordance with an embodiment. Referring to FIG. 5, the semiconductor apparatus 500 may include the same components as the semiconductor apparatus 200 illustrated in FIG. 2, and may have a configuration in which a plurality of semiconductor chips are coupled through not wire bonding but through electrodes such as through-silicon vias. Referring to FIG. 5, the semiconductor apparatus 500 may include a base chip 510 and a plurality of stacked semiconductor chips 520, 530, 540 and 550. The base chip 510 may be an interposer or a package substrate. The base chip 510 may correspond to the package substrate 210 illustrated in FIG. 2. The first to fourth stacked semiconductor chips 520, 530, 540 and 550 may correspond to the first to fourth semiconductor chips 220, 230, 240 and 250, respectively, illustrated in FIG. 2. The base chip 510 may be coupled with an external device through a package ball 511 such as a bump ball, and may communicate with the external device through the package ball 511. The base chip 510 may include a first substrate pad 512 and a second substrate pad 513. The first substrate pad 512 may be coupled with the package ball 511, and receive a signal from the external device or output a signal to the external device. The second substrate pad 513 may not be coupled with a package ball, and may not be coupled with the external device.

The first to fourth semiconductor chips 520, 530, 540 and 550 may be sequentially stacked on the base chip 510. Micro bumps MB may be disposed between the first to fourth semiconductor chips 520, 530, 540 and 550 to allow the first to fourth semiconductor chips 520, 530, 540 and 550 to be stacked upon one another and the stacked first to fourth semiconductor chips 520, 530, 540 and 550 to be electrically coupled with one another. The first semiconductor chip 520 may include a first main pad 521, a first auxiliary pad 522, a first buffer 523, and a second buffer 524. The second semiconductor chip 530 may include a second main pad 531, a second auxiliary pad 532, a third buffer 533, and a fourth buffer 534. The third semiconductor chip 540 may include a third main pad 541, a third auxiliary pad 542, a fifth buffer 543, and a sixth buffer 544. The fourth semiconductor chip 550 may include a fourth main pad 551, a fourth auxiliary pad 552, a seventh buffer 553, and an eighth buffer 554. The first main pad 521 may be coupled with the first substrate pad 512 through a through electrode TE1 which is formed in the base chip 510. The second to fourth main pads 531, 541 and 551 may not be coupled with through electrodes. The first auxiliary pad 522 may not be coupled directly with the first substrate pad 512. The first auxiliary pad 522 may be coupled with the second substrate pad 513 through another through electrode TE2 which is formed in the base chip 510. The second to fourth auxiliary pads 532, 542 and 552 may be coupled with the first auxiliary pad 522 and the second substrate pad 513 through through electrodes TE3, TE4 and TE5 which are formed in the first to third semiconductor chips 520, 530 and 540, respectively.

The first buffer 523 may be coupled with the first main pad 521 and the first auxiliary pad 522, and may be coupled also with the through electrode TE3 formed in the first semiconductor chip 520 and the second buffer 524. The second buffer 524 may be coupled with the first auxiliary pad 522 and the through electrode TE3, and may be coupled also with an internal circuit TNT of the first semiconductor chip 520. The third buffer 533 may be coupled with the second main pad 531 and the second auxiliary pad 532, and may be coupled also with the through electrode TE4 formed in the second semiconductor chip 530 and the fourth buffer 534. The fourth buffer 534 may be coupled with the second auxiliary pad 532 and the through electrode TE4, and may be coupled also with an internal circuit INT of the second semiconductor chip 530. The fifth buffer 543 may be coupled with the third main pad 541 and the third auxiliary pad 542, and may be coupled also with the through electrode TE5 formed in the third semiconductor chip 540 and the sixth buffer 544. The sixth buffer 544 may be coupled with the third auxiliary pad 542 and the through electrode TE5, and may be coupled also with an internal circuit INT of the third semiconductor chip 540. The seventh buffer 553 may be coupled with the fourth main pad 551 and the fourth auxiliary pad 552, and may be coupled also with a through electrode TE6 formed in the fourth semiconductor chip 550 and the eighth buffer 554. The eighth buffer 554 may be coupled with the fourth auxiliary pad 552 and the through electrode TE6, and may be coupled also with an internal circuit INT of the fourth semiconductor chip 550.

Referring to FIG. 5, the semiconductor apparatus 500 may be electrically coupled through through electrodes in replacement of the electrical coupling of the first to fourth semiconductor apparatuses 100, 200, 300 and 400 through wire bonding. The first main pad 521 of the first semiconductor chip 520 may be coupled with the first substrate pad 512 and the package ball 511 through the through electrode TE1, but the second to fourth main pads 531, 541 and 551 of the second to fourth semiconductor chips 530, 540 and 550 may not be coupled directly with the first main pad 521 and the first substrate pad 512. Therefore, a loading which the external device coupled with the package ball 511 expects for the semiconductor apparatus 500 may be reduced efficiently.

Figure 6:
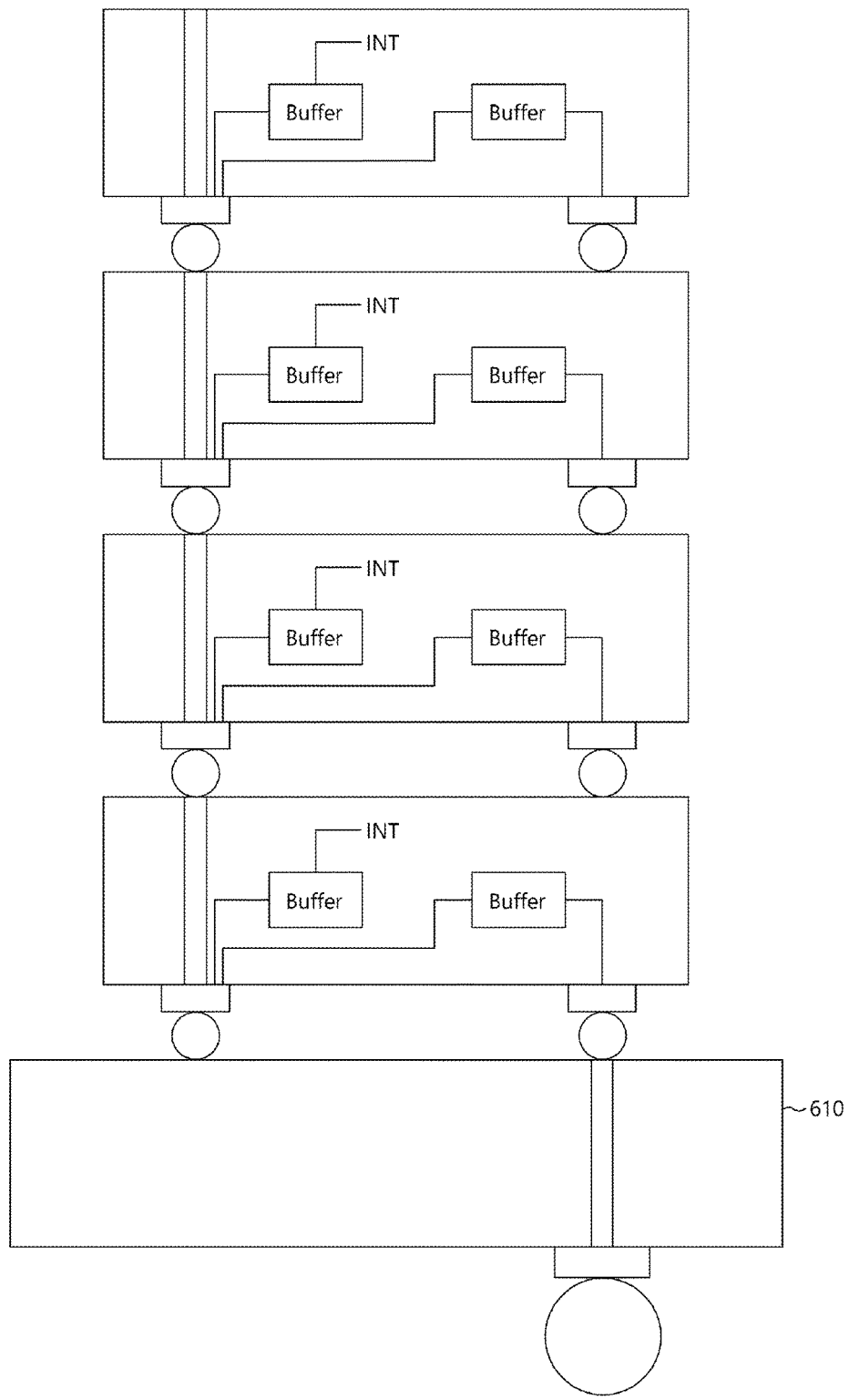
FIG. 6 is a diagram illustrating a representation of an example of the configuration of a semiconductor apparatus in accordance with an embodiment.

FIG. 6 is a diagram illustrating a representation of an example of the configuration of a semiconductor apparatus 600 in accordance with an embodiment. Referring to FIG. 6, while the semiconductor apparatus 600 has substantially the same structure as the semiconductor apparatus 500 of FIG. 5, there may be a difference in terms of the structure of a base chip. In the semiconductor apparatuses 100, 200, 300 and 400 illustrated in FIGS. 1 to 4, pads may be coupled through wire bonding. Therefore, in order for easy packaging, respective auxiliary pads may be wire-bonded with the substrate pad provided in a package substrate. However, in a package which uses through electrodes, respective auxiliary pads have little need to be coupled with a substrate pad. In a semiconductor apparatus which uses wire bonding, since a substrate pad is disposed inside a package substrate, the area of a package does not increase even when a plurality of substrate pads are formed. Conversely, in a semiconductor apparatus which uses through electrodes, since a substrate pad to be coupled with a package ball is disposed outside a package substrate and the size of the package ball to be coupled with the substrate pad is substantially large, the area of the package substrate and a package may increase. Thus, referring to FIG. 6, a base chip 610 of the semiconductor apparatus 600 may not include the second substrate pad 513 and the through electrode TE2 unlike the semiconductor apparatus 500 of FIG. 5.

Figure 7:
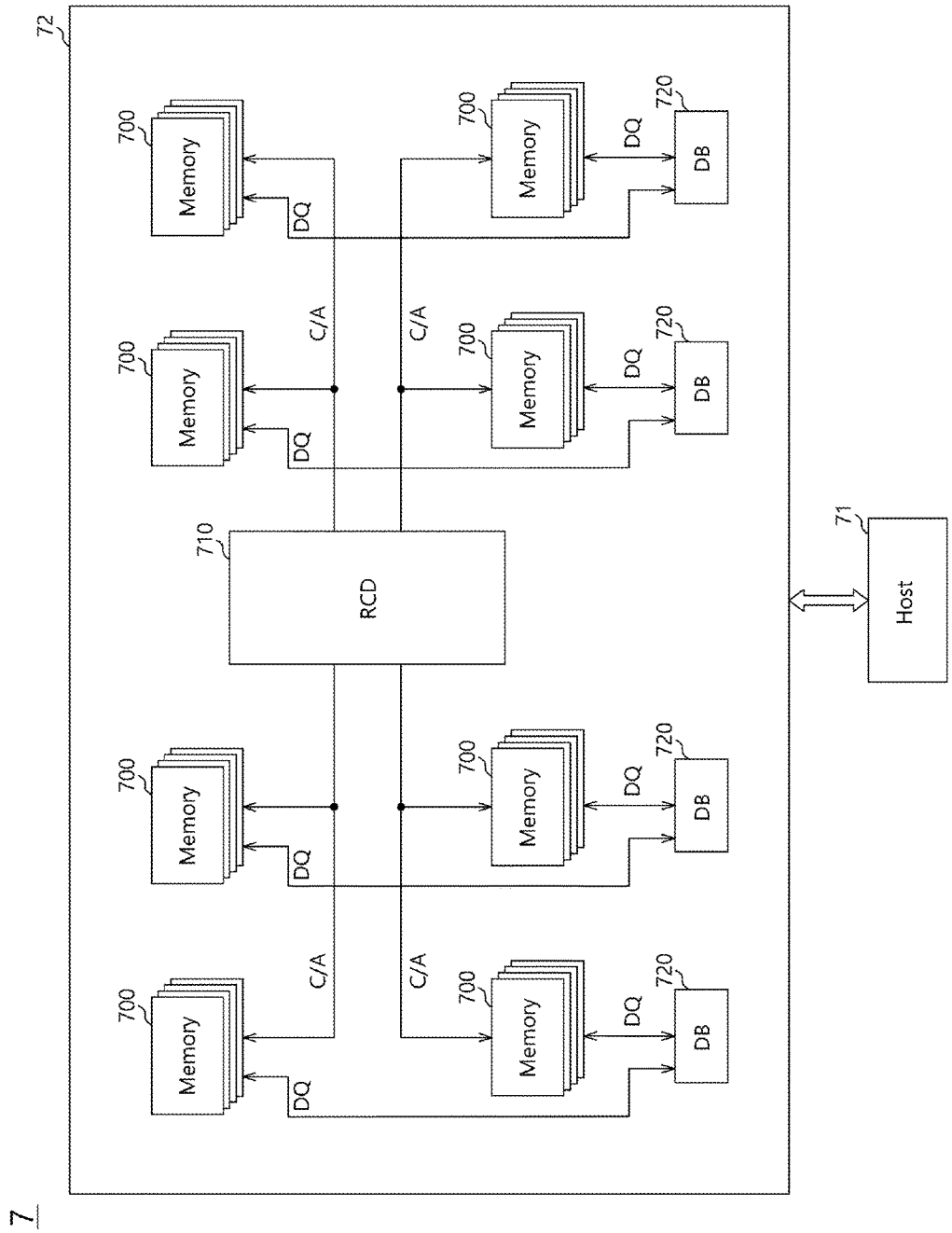
FIG. 7 is a diagram illustrating a representation of an example of the configuration of a semiconductor system in accordance with an embodiment.

FIG. 7 is a diagram illustrating a representation of an example of the configuration of a semiconductor system 7 in accordance with an embodiment. Referring to FIG. 7, the semiconductor system 7 may include a host 71 and a memory module 72. The host 71 may be a master device capable of controlling the memory module 72, and the memory module 72 may be a slave device which performs various operations by being controlled by the host 71. The host 71 may provide various signals such as a request, a command, an address signal and data to control the memory module 72. The host 71 may include a central processing unit (CPU), a graphic processing unit (GPU), a multimedia processor (MMP) or a digital signal processor (DSP). The host 71 may be realized in the form of a system-on-chip by combining processor chips having various functions, such as application processors (AP). The host 71 may be a memory controller.

The memory module 72 may include a plurality of memory apparatuses 700. Each memory apparatus 700 may include a volatile memory and a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM). In particular, each memory apparatus 700 may be a stack type memory apparatus in which a plurality of chips are stacked. The respective semiconductor apparatuses 100, 200, 300, 400, 500 and 600 illustrated in FIGS. 1 to 6 may be applied as the memory apparatus 700.

The memory module 72 may further include a register clock driver (RCD) 710 and a plurality of data buffers (DB) 720. Since the memory module 72 includes the register clock driver 710 and the data buffers 720, the memory module 72 may be a load reduced dual in-line memory module (LRDIMM). However, the type of the memory module 72 is not limited specifically, and the spirit of the present disclosure may be applied in the same or similar manner even to memory modules such as an unbuffered DIMM (UDIMM), a registered DIMM (RDIMM) and a small outline DIMM (SODIMM). Also, the spirit of the present disclosure may be applied in the same or similar manner even to any DIMM which adopts an advanced memory buffer (AMB) capable of performing the function of a host or a controller. The register clock driver 710 may buffer a command and address signal C/A received from the host 71, and may provide the command and address signal C/A to the plurality of memory apparatuses 700. Moreover, while not illustrated, the register clock driver 710 may buffer a clock signal received from the host 71, and may provide the clock signal to the plurality of memory apparatuses 700. The data buffers 720 may buffer data DQ received from the host 71, and may provide the data DQ to the plurality of memory apparatuses 700. The register clock driver 710 may be a unidirectional signal transmission circuit, and the data buffers 720 may be bidirectional signal transmission circuits.

The register clock driver 710 may be coupled with the plurality of memory apparatuses 700, respectively. For example, in FIG. 7, when the memory module 72 includes 8 memory apparatuses 700 and each memory apparatus 700 is a stack type memory apparatus in which 4 memory chips are stacked, the register clock driver 710 may expect a loading corresponding to total 32 memory chips. However, in the case where the configurations of the semiconductor apparatuses 100, 200, 300, 500 and 600 of FIGS. 1-3, 5, and 6 are applied to the memory apparatuses 700, the register clock driver 710 may expect only a loading corresponding to 8 memory chips. In the case where the configurations of the semiconductor apparatus 400 of FIG. 4 is applied to the memory apparatuses 700, the register clock driver 710 may expect only a loading corresponding to 16 memory chips. Therefore, the command and address signal C/A may be transmitted precisely from the register clock driver 710 to the memory apparatuses 700. Similarly, the data buffers 720 may be coupled with the respective memory apparatuses 700. For example, each data buffer 720 may be coupled with 2 memory apparatuses 700. Each data buffer 720 may expect a loading corresponding to total 8 memory chips. However, in the case where the configurations of the semiconductor apparatuses 100, 200, 300, 500 and 600 of FIGS. 1-3, 5, and 6 are applied to the memory apparatuses 700, each data buffer 720 may expect only a loading corresponding to 2 memory chips. in the case where the configurations of the semiconductor apparatus 400 of FIG. 4 is applied to the memory apparatuses 700, each data buffer 720 may expect only a loading corresponding to 4 memory chips. Therefore, data may be transmitted and received precisely between the data buffers 720 and the memory apparatuses 700.

While various embodiments have been described above, it will be understood to those skilled in the art that the embodiments described are examples only. Accordingly, the semiconductor apparatus and the semiconductor system including the same described herein should not be limited based on the described embodiments.

What is claimed is:
1. A semiconductor apparatus comprising:
a package substrate; and
a semiconductor chip,
wherein the package substrate comprises a substrate pad coupled with a package ball, wherein the semiconductor chip comprises:
a main pad coupled with the substrate pad;
a first buffer coupled with the main pad; and
an auxiliary pad coupled with the first buffer.

2. The semiconductor apparatus according to claim 1,
wherein transmission of a signal from the semiconductor chip to an external of the semiconductor chip is performed through the substrate pad, and
wherein reception of a signal received externally from the semiconductor chip is performed through the substrate pad.

3. The semiconductor apparatus according to claim 1, wherein the main pad is wire-bonded with the substrate pad, and the main pad and the auxiliary pad are indirectly coupled with each other.

4. The semiconductor apparatus according to claim 1, wherein the main pad is coupled with the substrate pad through a through electrode, and the main pad and the auxiliary pad are not coupled directly with each other.

5. The semiconductor apparatus according to claim 1, further comprising:
a second buffer coupled with the first buffer, the auxiliary pad and an internal circuit of the semiconductor chip.

6. The semiconductor apparatus according to claim 5, wherein the second buffer buffers a signal outputted from the first buffer and provides the buffered signal to the internal circuit of the semiconductor chip, or buffers a signal outputted from the internal circuit and provides the buffered signal to the first buffer.

7. A semiconductor apparatus comprising:
a package substrate; and
a first semiconductor chip and a second semiconductor chip stacked with the package substrate,
wherein the package substrate comprises a substrate pad coupled with a package ball,
wherein the first semiconductor chip comprises:
a first main pad coupled with the substrate pad;
a first buffer coupled with the first main pad;
a first auxiliary pad coupled with the first buffer; and
a second buffer coupled with the first buffer and the first auxiliary pad, and
wherein the second semiconductor chip comprises:
a second auxiliary pad coupled with the first auxiliary pad.

8. The semiconductor apparatus according to claim 7,
wherein transmission of a signal from the semiconductor chip to an external of the semiconductor chip is performed through the substrate pad, and
wherein reception of a signal received externally from the semiconductor chip is performed through the substrate pad.

9. The semiconductor apparatus according to claim 7, wherein the first main pad is wire-bonded with the substrate pad, and the first main pad is indirectly coupled with the first auxiliary pad.

10. The semiconductor apparatus according to claim 7, wherein the second buffer buffers a signal outputted from the first buffer and provides the buffered signal to an internal circuit of the first semiconductor chip, or buffer a signal outputted from the internal circuit and provides the buffered signal to the first buffer.

11. The semiconductor apparatus according to claim 7, wherein the second auxiliary pad is wire-bonded with the first auxiliary pad.

12. The semiconductor apparatus according to claim 11, further comprising:
a third semiconductor chip stacked with the first and second semiconductor chips over the package substrate,
wherein the third semiconductor chips comprises a third auxiliary pad, and
wherein the third auxiliary pad of the third semiconductor chip is wire-bonded with the second auxiliary pad.

13. The semiconductor apparatus according to claim 12,
wherein the second semiconductor chip further comprises a second main pad, and the third semiconductor chip further comprises a third main pad, and
wherein the second main pad and the third main pad are not wire-bonded with the substrate pad.

14. The semiconductor apparatus according to claim 7,
wherein the second semiconductor chip further comprises:
a second main pad;
a third buffer coupled with the second main pad; and
a fourth buffer coupled with the third buffer and the second auxiliary pad, and
wherein the second main pad is not wire-bonded with the substrate pad.

15. A semiconductor apparatus comprising:
a package substrate; and
a first semiconductor chip stacked over the package substrate,
wherein the package substrate comprises:
a substrate pad which is coupled with a package ball, and
wherein the first semiconductor chip comprises:
a main pad coupled with the substrate pad;
an auxiliary pad; and
a buffer configured to couple the main pad and the auxiliary pad.

16. The semiconductor apparatus according to claim 15,
wherein the semiconductor apparatus further comprises a plurality of semiconductor chips which are stacked with the first semiconductor chip,
wherein each of the plurality of semiconductor chips comprises a main pad and an auxiliary pad, and
wherein the auxiliary pads of adjacent semiconductor chips among the plurality of semiconductor chips are wire-bonded with each other, and main pads of the plurality of semiconductor chips are not wire-bonded with the first substrate pad.

17. The semiconductor apparatus according to claim 15,
wherein the semiconductor apparatus further comprises a plurality of semiconductor chips which are stacked with the first semiconductor chip,
wherein each of the plurality of semiconductor chips comprises a main pad and an auxiliary pad,
wherein the first semiconductor chip and the plurality of semiconductor chips are classified into first to n^th groups, the main pad of at least one semiconductor chip of each group is wire-bonded with the substrate pad, and the auxiliary pads of semiconductor chips of each group are wire-bonded with each other, and
wherein n is an integer equal to or greater than two.

18. The semiconductor apparatus according to claim 16,
wherein the auxiliary pads of adjacent semiconductor chips among the plurality of semiconductor chips in the each group are wire-bonded with each other.

* * * * *